> United States Patent [19]

Kitchen et al.

[11] 4,214,904
[45] Jul. 29, 1980

[54] GOLD-TIN-SILICON ALLOY FOR BRAZING SILICON TO METAL

[75] Inventors: Donald R. Kitchen, Griffiss AFB, N.Y.; Loren A. Jacobson, Alexandria, Va.

[73] Assignee: The United States of America as represented by the Secretary of the Air Force, Washington, D.C.

[21] Appl. No.: 968,873

[22] Filed: Dec. 12, 1978

[51] Int. Cl.$^2$ .................. H05K 1/04; C22C 5/00
[52] U.S. Cl. ............................. 75/165; 428/641
[58] Field of Search ..................... 75/165; 428/641; 357/65

[56] References Cited

U.S. PATENT DOCUMENTS

| | | | |
|---|---|---|---|
| 2,747,971 | 5/1956 | Hein | 23/223.5 |
| 3,099,539 | 6/1963 | Tang | 29/183.5 |
| 3,158,471 | 11/1964 | Kadelburg | 75/165 |
| 3,340,602 | 9/1967 | Hontz | 29/588 |
| 3,579,312 | 5/1971 | Short | 29/195 |
| 3,769,006 | 10/1973 | Ingersoll | 75/165 |
| 3,956,098 | 5/1976 | Welch et al. | 204/286 |

*Primary Examiner*—L. Dewayne Rutledge
*Assistant Examiner*—Upendra Roy
*Attorney, Agent, or Firm*—Joseph E. Rusz; Cedric H. Kuhn

[57] ABSTRACT

An alloy for brazing a silicon die to a gold-plate kovar header consists essentially of 19 to 21 weight percent tin and 0.6 to 0.8 weight percent silicon with the balance being gold. The alloy melts at a temperature below 200° C. which is substantially lower than that of the conventional gold-silicon eutectic alloy.

4 Claims, No Drawings

GOLD-TIN-SILICON ALLOY FOR BRAZING SILICON TO METAL

RIGHTS OF THE GOVERNMENT

The invention described herein may be manufactured and used by or for the Government of the United States for all governmental purposes without the payment of any royalty.

FIELD OF THE INVENTION

This invention in one aspect relates to an alloy for brazing silicon to a metal substrate. In a more specific aspect, it relates to a braze alloy for bonding silicon dies to gold-plated kovar headers. In another aspect, it relates to a method for bonding silicon to metal substrates.

BACKGROUND OF THE INVENTION

There exists a need for increasing the reliability of integrated, electronic circuit devices. The long term reliability of a device is often limited by the braze alloy which bonds the circuit chip of the device to its header or substrate. Thus, integrated circuits in current use frequently fail because the braze alloy fractures, causing the device to short out.

Semiconductor silicon chips are conventionally bonded to substrates with low melting point materials, including hard solders, soft solders and epoxies. Hard solders are alloys which are free from temperature fatigue failures while soft solders are subject to such failures. This distinction has restricted hard solders to the low melting gold-eutectics while soft solders include practically all lead- and tin-based alloys. Epoxies are used when the physical and chemical characteristics of the chip are adversely affected by the high temperature generated by the brazing operation. In general, when soft solders and epoxies are compared to hard solders, the soft solders and epoxies exhibit greatly inferior strength, thermal and adhesive properties. Accordingly, it has been generally concluded that hard solders give the best performance in brazing operations and best device reliability. Furthermore, the best hard solder presently available for brazing silicon dies appears to be the gold-silicon eutectic alloy. However, it has been found that even this alloy does not always give satisfactory results in that it sometimes fails to properly attach the silicon die to the substrate.

A gold-silicon eutectic alloy contains 2.85 weight percent silicon and has a minimum melting temperature of 363° C. Because of thermodynamic requirements, the gold-silicon braze alloy would have to contain a greater percentage of silicon than 2.85 weight percent in order to ensure wetting of the silicon die. However, at higher than 2.85 weight percent silicon, the melting point of gold-silicon alloys increases rapidly. The high melting point of such an alloy can result in damage to the integrated circuit during the brazing operation.

It is a principal object of this invention to provide a braze alloy having a melting point that is substantially lower than the conventional gold-silicon braze alloy.

Another object of the invention is to provide a braze alloy having the ability to consistently "wet" silicon, a property of the alloy necessary for proper bonding of the die to the substrate.

A further object of the invention is to provide a braze alloy having the capability of providing a bond between the silicon die and substrate that meets established strength specifications.

Still another object of the invention is to provide a method for bonding silicon dies to a metal substrate.

Other objects and advantages of the invention will become apparent to those skilled in the art upon consideration of the accompanying disclosure.

SUMMARY OF THE INVENTION

The present invention resides in a braze alloy consisting essentially of about 19 to 21 weight percent tin and about 0.6 to 0.8 weight percent silicon, the remainder being gold, i.e., about 78.2 to 80.4 weight percent gold. A preferred composition consists essentially of 20.0 weight percent tin, 0.6 weight percent silicon, and 79.4 weight percent gold.

The braze alloy of this invention is intended primarily for use as a replacement or substitute for the gold-silicon eutectic alloy conventionally employed to braze silicon dies to gold-plated metal substrates or headers. In order for a bond to form between the die and substrate, the silicon die itself must be in equilibrium with the molten braze material during the bonding operation. The problems associated with the use of a gold-silicon alloy as the brazing material can be more fully appreciated by considering briefly the three different cases of equilibrium freezing that depend upon whether the gross composition of the alloy lies on, to the left, or to the right of the eutectic composition.

The hypoeutectic gold-silicon alloy is the alloy which lies to the left of the eutectic composition and thus contains less than 2.85 weight percent silicon. As the molten alloy cools and freezing begins, crystals of gold separate out. The gold crystals continue to grow until the eutectic temperature (363° C.) is reached at which point the remaining liquid forms the eutectic structure.

The hypereutectic alloy is the alloy which lies to the right of the eutectic composition and thus contains more than 2.85 weight percent silicon. The equilibrium freezing of this alloy follows a pattern similar to that described above for hypoeutectic alloys except that silicon rather than gold crystals separate out when freezing begins. As freezing continues with decreasing temperature, the silicon grains grow until the eutectic temperature is reached at which point the remaining liquid forms the eutectic structure.

In the equilibrium freezing of the eutectic alloy, no phase change occurs upon cooling until the eutectic temperature (363° C.) is reached. At this temperature the liquid decomposes into two solid phases, gold and silicon, simultaneously. At room temperature, the resulting structure is only the eutectic structure. No large grains of gold or silicon appear as they do upon equilibrium freezing of hypoeutectic and hypereutectic alloys. Furthermore, the gold plate on the header tends to dilute the composition of the eutectic alloy so that the braze alloy stays in equilibrium with the gold plate on the header and not with the silicon die. Attempts have been made with only limited success to overcome this problem by gold plating the silicon die before brazing.

From the foregoing discussion, certain conclusions can be drawn regarding gold-silicon alloys. The use of a hypoeutectic alloy is unsatisfactory since its liquid remains in chemical equilibrium only with gold. The eutectic composition is also undesirable because the eutectic liquid is in chemical equilibrium with gold or silicon only at the eutectic temperature. The hypereutectic alloys are the only alloys in the gold-silicon system that remain in chemical equilibrium with silicon during cooling. However, the addition of only a small amount of silicon to the eutectic composition significantly increases the melting point of any hypereutectic alloy. In fact, the temperature increase is so large that the integrated circuit on the silicon die may become damaged during the brazing operation.

In accordance with the present invention, the problem associated with the use of gold-silicon alloys as brazing materials is overcome by providing a ternary system. As defined hereinabove, the ternary system consists essentially of specific amounts of gold, silicon and tin. It has been discovered that the addition of about 19 to 21 weight percent tin to a gold-silicon system causes a lowering of the composition's melting point. The choice of tin was predicated upon the requirement that the ternary system formed be eutectic in the sense that each of the constituent binary systems is eutectic. Also, in order for the eutectic temperature of the ternary system to be below 363° C., at least one of the binary components must have its eutectic temperature below 363° C., the eutectic temperature of the gold-silicon eutectic composition. Since tin forms a simple binary eutectic system with silicon and has a eutectic temperature of 232° C., this alloy system meets the two requirements for being one of the binary eutectic components to the ternary eutectic system.

While tin and gold do not form a simple binary eutectic system, the resulting system has the characteristics of a simple eutectic system if the amount of tin is limited to a maximum of 37.4 weight percent. Thus, this limit bounds a system containing a eutectic alloy located at 80 weight percent gold and 20 weight percent tin and melting at a eutectic temperature of 280° C. Both of these properties fulfill the requirements for being the third binary eutectic component to the ternary system.

As a prerequisite to proper bonding, the braze alloy must contain more silicon than the eutectic alloy in order to maintain equilibrium between the die and braze alloy upon melting. It was found that this requirement was met by adding silicon in the critical amount 0.6 to 0.8 weight percent to the gold-tin eutectic alloy as described above. Thus, the braze composition is one consisting essentially of 19 to 21 weight percent tin, 78.2 to 80.4 weight percent gold and 0.6 to 0.8 weight percent silicon. The braze alloy melts at an average temperature of about 198° C., but the melt temperature can be varied from as low as about 180° C. to the melting point of silicon. The melt temperature is substantially lower than that of the conventional gold-silicon eutectic alloy, an important factor in protecting integrated circuits from damage during brazing operations. A comparison of the composition of the invention alloy with that of the gold-silicon eutectic alloy reveals that the amount of gold required in the former is greatly reduced. Furthermore, use of the present braze alloy eliminates any need for gold plating the silicon before the brazing operation.

A more complete understanding of the invention can be obtained by referring to the following illustrative examples which are not intended, however, to be unduly limitative of the invention.

EXAMPLE I

Runs were conducted in which alloy compositions A and B of the present invention were prepared. A control run was also carried out in which an alloy was prepared by following the same procedure.

In preparing the alloys, a BREW Model 300 high vacuum furnace was utilized. A scanning differential calorimeter was used to measure melting points.

The overall composition of each alloy was selected to contain about 20 weight percent tin. The weight percent of silicon was then chosen, which also established the weight percent of gold required. The weight percentages for the components are shown hereinafter in the table. Each of the elements was placed in a 5 ml boron nitride crucible which was positioned in the heating chamber of the furnace. A vacuum was pulled on the furnace chamber from $1.6 \times 10^{-4}$ to $7.4 \times 10^{-4}$ torr to minimize the possibility of oxidizing the silicon. The temperature was increased to a maximum of 1500° C. to ensure that the silicon in the alloy completely melted. The power to the furnace was then turned off and the entire system was purged with helium so as to cool the system as quickly as possible. The crucible was removed from the furnace when the temperature stabilized at 100° C. The total elapsed time to manufacture the alloy was 20 minutes for the start of the melting operation to removal of the crucible from the furnace.

After the crucible was removed from the furnace, it was allowed to cool to room temperature. The alloy was removed from the crucible and placed on a balance for reweighing. In each case the alloy lost weight. At 1500° C., the vapor pressure of tin is about 0.210 torr while the vapor pressures of silicon and gold are 0.001 and 0.017, respectively. It was assumed that the elements were lost from the melt in the same ratio as the vapor pressures so that the weight loss in the alloys is attributable mostly to tin. The weight loss in percent is set forth in the table.

Each alloy prepared as described above was sectioned into smaller pieces with a low speed diamond saw to a thickness of 0.381 mm. Each section was degreased in acetone and methanol, rinsed in distilled water, and finally dried with hot air. In order to determine the melting points, the samples were placed in the sample holder of the scanning differential calorimeter (SDC). The thermal data obtained from each thermogram of the alloys generated by the SDC are shown in the table.

TABLE

| Alloy | Alloy Composition, wt % | | | Weight loss,% | Eutectic Temp, °C. | Liquidus Temp, °C. | Peak Value of Liquidus Temp, °C. |
|---|---|---|---|---|---|---|---|
| | Gold | Tin | Silicon | | | | |
| A | 79.60 | 19.80 | 0.60 | 1.98 | 194 | 273 | 284 |
| B | 79.32 | 19.98 | 0.70 | 1.13 | 199 | 275 | 293 |
| Control | 79.00 | 20.00 | 1.00 | 0.14 | 196 | 273 | 289 |

The data in the foregoing table indicate that the braze alloy of this invention (A and B) melt at a temperature below 200° C. However, it appeared from a study of the thermogram of alloy B that a eutectic temperature exists at 180° C.

It is noted from the data that the liquidus temperature is relatively constant whereas for varying compositions the liquidus temperature of each alloy should be different. However, since the overall composition of the ternary alloy contains about 20 weight percent tin and at least 70 weight percent gold, the matrix structure consists primarily of the binary gold-tin eutectic structure which melts at 280° C. Thus, the liquidus temperatures shown by the thermograms correspond generally to the melting temperature of the matrix structure of the ternary alloy which is essentially the binary gold-tin structure.

EXAMPLE II

Alloy A and the control alloy prepared as described in Example I were each used to braze a silicon die to a gold-plated kovar substrate. The silicon dies and substrates were cleaned prior to bonding by immersion in acetone, rinsing in methanol, further rinsing in distilled water, and drying in air. Furthermore, the silicon dies were dipped in a 48% solution of hydrofluoric acid and rinsed in distilled water to remove any native oxide.

The manual scrubbing process was used to bond the silicon die to the substrate. Initially, the gold-plated header was clamped into an aluminum jig which was mounted on a heater block. After the temperature stabilized at 300° C., the braze alloy was placed upon the top of the header. The silicon die was then picked up with tweezers and positioned upon the braze material. The die was manually scrubbed into the header using light axial pressure. A gloved box enclosed the system which was maintained under a nitrogen atmosphere. After bonding, the die-substrate combination was allowed to cool to room temperature in the nitrogen atmosphere before venting the system.

Pictures were taken of the die-substrate combinations with a scanning electron microscope. The pictures taken of the combination using alloy A as the brazing material showed that there was widespread melting of the braze alloy surrounding the silicon die and that wetting occurred between the alloy and the silicon die. The picture taken of the combination using the control alloy (a 1.0 weight percent silicon alloy) showed that this alloy was not wetting the substrate as evidenced by the fact that the alloy was not flowing over the surface of the substrate. The picture showed also that the braze alloy was not wetting the surface of the silicon die.

The die-header combinations using alloy A and the control alloy were subjected to a standard push-off test performed according to MIL-STD 883B, Method 2019.1, Aug. 31, 1977. A Universal Bond Pull Tester manufactured by ETP Engineered Technical Products, Sommerville, N.J., was the test instrument used. In the tests the bond produced with alloy A withstood a 1000 gram shear force. However, the bond produced with the control Alloy failed at a shear force of 275 grams.

From the foregoing, it is seen that the present invention provides a braze alloy which is effective in bonding silicon dies to gold-plated metal substrates at a brazing temperature which is substantially lower than that required when using a conventional gold-silicon eutectic alloy as the brazing material. The possibility of damage to the integrated circuit during the brazing operation is thereby minimized. The present alloy has the ability to consistently wet silicon, a property of the alloy necessary for proper bonding of the die to the substrate. And the alloy reduces the amount of gold required in the currently popular brazing alloy, an important economic advantage.

As will be evident to those skilled in the art, modifications of the present invention can be made in view of the foregoing disclosure without departing from the spirit and scope of the invention.

We claim:

1. A braze alloy for brazing silicon to a metal substrate, said alloy consisting essentially of about 19 to 21 weight percent tin and about 0.6 to 0.8 weight precent silicon, the balance being gold.

2. The braze alloy according to claim 1 which consists essentially of 20 weight percent tin, 0.6 weight percent silicon, and 79.4 weight percent gold.

3. An article of manufacture comprising a silicon die bonded to a metal substrate with a braze alloy consisting essentially of about 19 to 21 weight percent tin and about 0.6 to 0.8 weight percent silicon, the balance being gold.

4. The article of manufacture according to claim 3 in which the braze alloy consists essentially of 20 weight percent tin, 0.6 weight percent silicon, and 79.4 weight percent gold.

* * * * *